United States Patent
Mazzucco et al.

(10) Patent No.: US 6,377,053 B1
(45) Date of Patent: Apr. 23, 2002

(54) DEVICE FOR DETECTING SHORT-CIRCUITS

(75) Inventors: Michelangelo Mazzucco, Santa Maria Del Tempio; Giampietro Maggioni, Cornaredo, both of (IT)

(73) Assignees: SGS-Thomson Microelectronics S.r.l., Agrate Brianza (IT); Magneti Mareui S.p.A., Milan (IT)

( * ) Notice: Subject to any disclaimer, the term of this patent is extended or adjusted under 35 U.S.C. 154(b) by 0 days.

(21) Appl. No.: 09/028,731

(22) Filed: Feb. 24, 1998

(30) Foreign Application Priority Data

Mar. 4, 1997 (EP) .............................. 97830092

(51) Int. Cl.[7] .................... G01R 31/14; G01R 31/08
(52) U.S. Cl. ...................... 324/509; 324/523
(58) Field of Search ................. 324/509, 522, 324/523, 527

(56) References Cited

U.S. PATENT DOCUMENTS

| | | | | |
|---|---|---|---|---|
| 3,992,663 A | * | 11/1976 | Seddick ..................... | 324/537 |
| 4,682,120 A | * | 7/1987 | Palara et al. ................ | 330/298 |
| 4,734,651 A | * | 3/1988 | Keller et al. ................ | 324/538 |
| 4,764,685 A | * | 8/1988 | Bleckmann et al. ........ | 324/162 |
| 5,181,205 A | * | 1/1993 | Kertis ........................ | 324/522 |
| 5,272,445 A | * | 12/1993 | Lloyd et al. ................ | 324/705 |
| 5,304,935 A | * | 4/1994 | Rathke et al. .............. | 324/418 |
| 5,341,282 A | * | 8/1994 | Brambilla et al. ........... | 363/50 |
| 5,359,291 A | * | 10/1994 | Dommerich, III .......... | 324/522 |
| 5,451,881 A | * | 9/1995 | Finger ........................ | 324/433 |
| 5,747,978 A | * | 5/1998 | Gariboldi et al. ........... | 323/313 |

FOREIGN PATENT DOCUMENTS

| | | | |
|---|---|---|---|
| DE | 29 40 598 A1 | 5/1981 | ........... G08B/29/00 |
| DE | 3724142 A1 | 2/1989 | ......... G01R/19/165 |
| EP | 0 689 958 A2 | 6/1995 | ........... G01R/31/02 |

* cited by examiner

Primary Examiner—Safet Metjahic
Assistant Examiner—Jermele M. Hollington
(74) Attorney, Agent, or Firm—Lisa K. Jorgenson; Allen, Dyer, Doppelt, Milbrath & Gilchrist, P.A.

(57) ABSTRACT

The short-circuit detecting device includes a current generator for generating a current ($I_{IN}$) of predetermined intensity, selectively into or out of the terminal (IN), and a first voltage comparator connected to the terminal (IN) and connected to the current generator in a manner such that the generator generates a current ($I_{IN}$) in the inward direction and in the outward direction relative to the terminal (IN), respectively, when the voltage between the terminal (IN) and the ground is greater than a first level and less than a second level, respectively. The first level is greater than or equal to the second. The device also includes a second voltage comparator for supplying a first and a second signal, respectively, when the voltage between the terminal (IN) and the ground is close to the supply voltage (Vcc) and close to the ground potential (gnd), respectively, and a processing circuit connected to the second comparator for detecting whether the first or the second signal, respectively, persists for a predetermined period of time. In this case, an output signal (F_Vcc; F_gnd) is supplied which is indicative of a short-circuit of the terminal (IN) to the supply (Vcc) or to ground, respectively.

25 Claims, 2 Drawing Sheets

DEVICE FOR DETECTING SHORT-CIRCUITS

FIELD OF THE INVENTION

The present invention relates in general to electronic devices, and, more particularly, to devices which can detect non-intermittent short-circuits towards ground and towards a supply.

BACKGROUND OF THE INVENTION

There is a need to detect, at an input terminal, the presence of a short-circuit towards ground or towards the supply. The short-circuit indication should avoid indicating intermittent or partial short-circuits. The term "short-circuit" is intended to indicate a connection having a resistance equal to or less than a given value (for example, 20 Kohms). Circuits of this type, which can perform the aforementioned functions, accurately and reliably and which, at the same time, are simple and inexpensive, are not known in the art.

SUMMARY OF THE INVENTION

The object of the present invention is to provide a circuit for detecting short-circuits, which overcomes the problems indicated above in a satisfactory manner.

According to the present invention, this object is achieved by means of a circuit for detecting short-circuits comprising current-generating means for generating a current of predetermined intensity selectively into or out of a desired terminal. The device may also include first voltage-comparator means connected to the desired terminal and connected to the current-generating means in a manner such that the current-generating means generates a current in the inward direction and in the outward direction relative to the desired terminal when a voltage between the desired terminal and ground is greater than a first level and less than a second level, respectively, the first level being greater than or equal to the second level. In addition, the device preferably includes second voltage-comparator means for supplying a first and a second signal, respectively, when the voltage between the desired terminal and ground is close to the direct-current supply voltage and close to ground, respectively. Processing-circuit means may be connected to the second comparator means for detecting whether the first or the second signal, respectively, lasts for a predetermined period of time and, responsive thereto, for supplying an output signal indicative of a short-circuit of the terminal towards the supply or towards ground, respectively.

BRIEF DESCRIPTION OF THE DRAWINGS

Further advantages and characteristics of the present invention will become clear from the following detailed description, given with the aid of the appended drawings, provided by way of non-limiting example, in which.

DETAILED DESCRIPTION OF THE PREFERRED EMBODIMENTS

Figure 1:
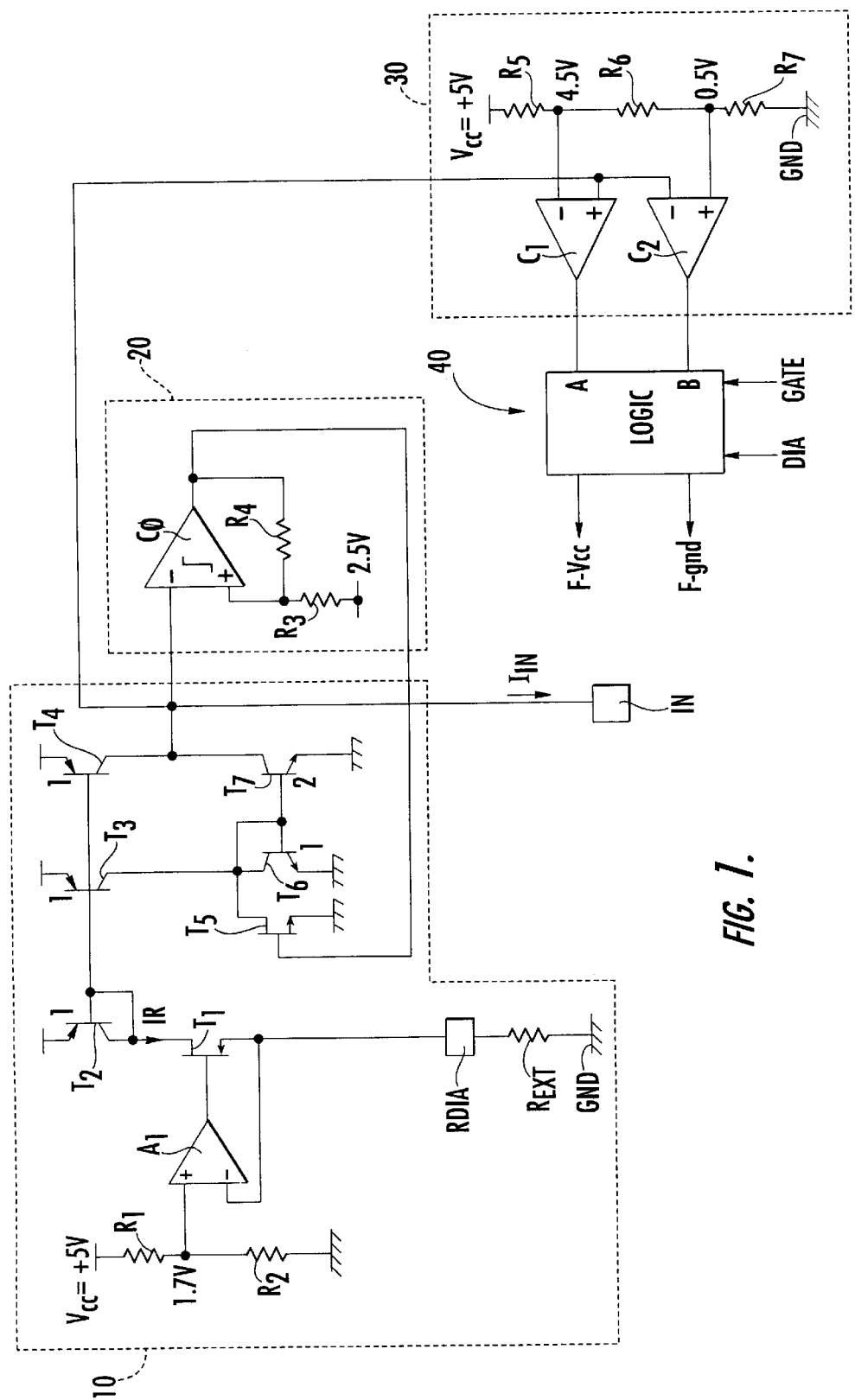
FIG. 1 is a circuit diagram of an embodiment of the circuit according to the invention.

The present invention is based essentially on the principle that a current $I_{IN}$ is supplied to an input terminal IN of which the short-circuit diagnosis or determination is to be made. A block diagram of a circuit according to the invention is shown in FIG. 1.

The circuit block diagram illustratively includes a circuit 10 which can generate a current $I_{IN}$ into or out of an input terminal IN, and which comprises two resistors R1, R2, an operational amplifier A1, a resistor Rext, and transistors T1, T2, T3, T3, T4, T6 and T7, connected in the manner shown. The circuit block diagram also includes a circuit 20 which has the function of controlling the direction of the current $I_{IN}$ and which is formed by a comparator with hysteresis having low and high threshold voltages VL and VH, of (for example) 2V and 3V, respectively, and comprising an operational amplifier CO and two resistors R3, R4. The output of this circuit controls a switch provided by a MOS transistor T5 included in the circuit 10.

The circuit block diagram also illustratively includes a circuit 30 which is connected to the terminal IN and which detects when the voltage at the terminal IN is between (for example) 4.5 V and 5 V or between ground (0 V) and 0.5 V, by means of a resistive divider R5, R6, R7 and two comparators C1 and C2, respectively, connected in the manner shown. Further the circuit includes a logic circuit 40 which, during the time in which an external GATE signal is high, checks that there are no changes in the signals at its two inputs A and B.

The following may occur at the trailing edge of the GATE signal:

1) if the signal A has remained at a high logic level throughout the time for which the GATE signal was at high level, a "1" will be loaded into a flip-flop F3A (FIG. 2), the output of which is indicated F__Vcc; if, during the same time interval, the signal A has remained at a low logic level or has had even only one change, the flip-flop F3A will be loaded with a "0" and its output F__Vcc will consequently be "0"; and 2) a second flip-flop F3B, the output of which is indicated F__gnd, will behave in the same way with respect to the signal B as described with reference to the signals A, F__Vcc and to the flip-flop F3A mentioned in point (1) above.

The two flip-flops F3A, F3B, loaded as described in points 1 and 2 can be zeroed by respective RESET terminals connected to an external line DIA. This will be referred to further below.

With the structure described above, if there is a short-circuit between the input IN and earth or ground, the output of the comparator C0 is high and causes the transistor T5 to be saturated. A current IR generated by R1, R2, A1, T1 and Rext through the current mirror T2, T3 will thus send towards the input IN a current $I_{IN}$ of about:

$$Vcc\ R2/((R1+R2)*Rext)$$

With, for example, a supply voltage Vcc of about 5 V, a resistor Rext of 68 Kohms and resistors R1, R2 of sizes such as to produce 1.7 V, the current at the drain terminal of the transistor T1 will be 25 $\mu$A and this same current will be sent to the input IN by means of the current mirror T2, T4.

If there is a complete short-circuit, the supply of the current $I_{IN}$ described above will not be able to modify the voltage at the input IN. The input (−) of the comparator R2 will consequently perceive a voltage lower than 0.5 V and will bring the input B of the logic circuit to high level, thus indicating a short-circuit to ground. Naturally, this indication will then be checked to ascertain if it is intermittent or stable before it is indicated as a short-circuit by the signal F_gnd being brought to high level.

However, in the case of an actual short-circuit, and, hence, one with an associated resistance other than zero, this will be detected and indicated as short-circuit only if its resistive

3 value, multiplied by the value of the current $I_{IN}$ sent from the transistor T4 (25 μA), does not exceed the threshold voltage of the comparator R2. In the example given above, if this threshold voltage is 0.5 V, the maximum resistance permitted between the input IN and ground for this to be recognized as a short-circuit will be:

Vcc(MAX)–0.5 V/25 μA=20 Kohms

Naturally, the current $I_{IN}$ sent to the input IN will continue to be supplied by the transistor T4 until the voltage at the input IN is below 3V. This ensures that, for any value of the voltage at the input IN between earth (0 V) and 0.5 V, the current $I_{IN}$ supplied will flow in the outward direction, that is, will be directed towards ground.

Naturally, to detect an actual short-circuit towards the supply Vcc with a given resistance value, it is necessary to reverse the direction of the current $I_{IN}$ supplied to the input IN, that is, it must be an inward current. This is provided for by the comparator with hysteresis C0. At the moment when the voltage at the input IN exceeds 3V, the output voltage of the comparator C0 will go to zero, cutting off the MOS transistor T5. The current mirror provided by the transistors T6, T7 can thus operate, and multiplies by 2 the current of the transistor T3, which is equal to that of the transistor T4. The current of the transistor T7 is then subtracted from that of the transistor T4 and the resulting effect will, therefore, be that a current $I_{IN}$ which (with the numerical values given by way of example above) is equal to 25 μA (in fact: $I_{IN}$=Ic(T4)–Ic(T7)=25 μA–50 μA=–25 μA) is "drawn" from the input IN. Naturally, the comments expressed for a short-circuit to ground apply, in the same manner, to a short-circuit to the supply Vcc.

In this case, the threshold for determining whether there is a short to the supply Vcc is that associated with the comparator C1, that is, for example: 4.5 V or 0.5 V below Vcc. Thus, if the resistance of the short-circuit to Vcc, multiplied by the current $I_{IN}$ set by the transistors T7, T4 (that is, $I_{IN}$=25 μA), does not exceed 0.5 V, the output of the comparator C1 will go to the high voltage level. This means that the maximum resistance permitted for a short-circuit to the supply Vcc corresponds to a value of 0.5 V/25 μA=20 Kohms, as in the previous case of a short-circuit to earth.

Naturally, the logic circuit 40 also checks whether the short-circuit is intermittent or stable in this case, as will be explained further below.

Moreover, as described for the short-circuit to ground, until the voltage at the input IN is between the values envisaged for a short-circuit to the supply Vcc (Vcc, Vcc–0.5 V), the comparator C0, since it has a low switching threshold of 2V, ensures that the transistor T5 is cut off, so that a current of 25 μA is "drawn" from the input IN. The accuracy of the absolute value of the current generated by the reference is ensured by the accuracy of the external resistance Rext and depends on the supply voltage Vcc. The dependence on the supply voltage ensures the accuracy of the measurement of the maximum short-circuit resistance with variations of the supply voltage, in fact:

Vcc(MAX)=Vs/$I_{IN}$ with

Vs=Vcc*R1/(R1+R1+R1)=Vcc*K1 for a short-circuit to ground, or

Vs=Vcc*(1–R1/(R1+R1+R1))=Vcc*K1' for a short-circuit to Vcc $I_{IN}$=Vcc*R2/((R1+R2)*Rext)=Vcc*K2/Rext Vcc(MAX)=Rext*K1(or K1')/K2

4 where K1, K1' and K2 are resistive ratios obtained with resistances all of which are within the circuit, which is preferably formed as an integrated circuit, so that great accuracy in their relative resistive values is ensured. The maximum value of the resistance of the short-circuit detected therefore depends essentially on the accuracy of the external resistance Rext, the accuracy of which will be selected by the user according to the application.

Figure 2:
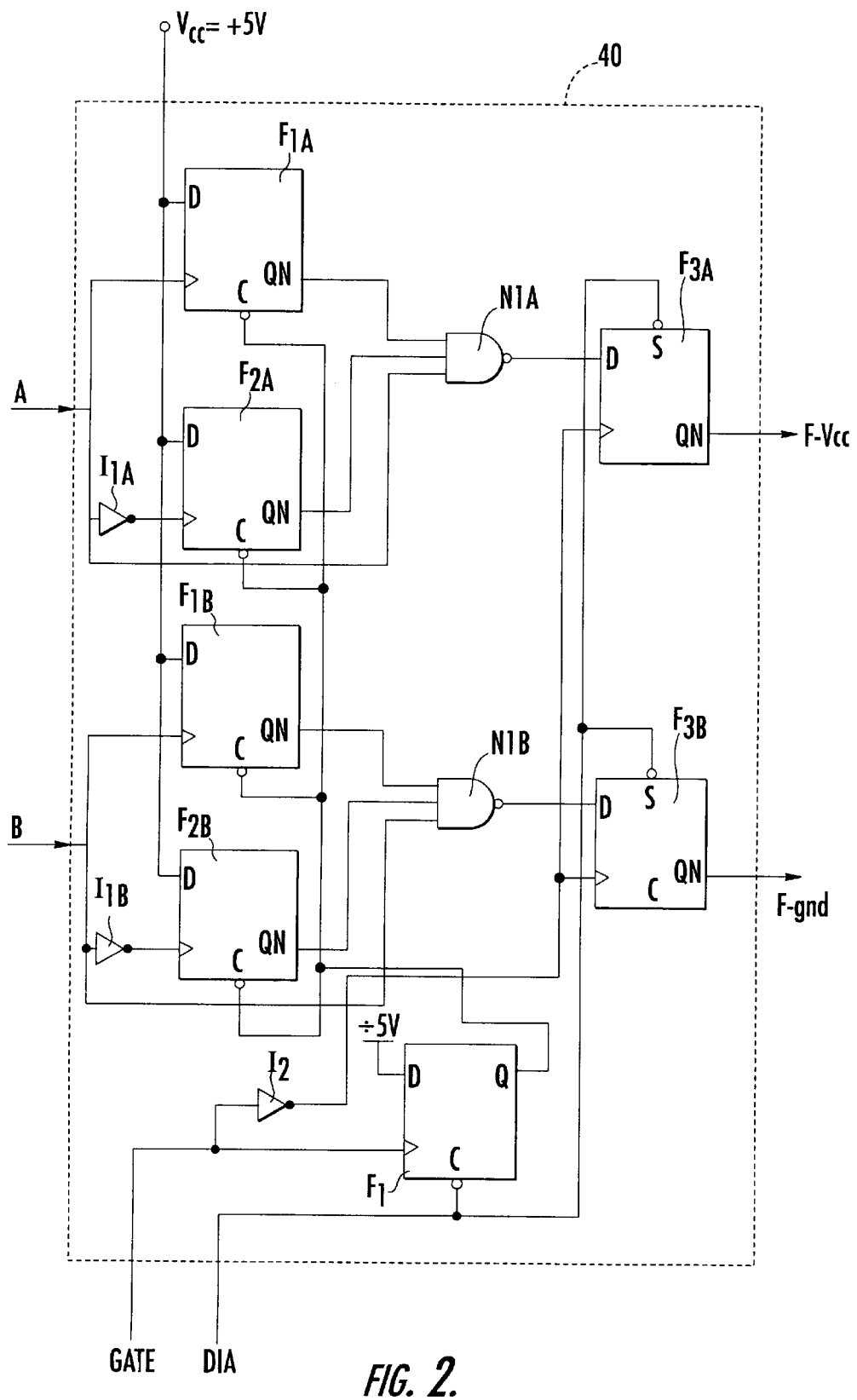
FIG. 2 is a circuit diagram of a portion of the circuit shown in FIG. 1.

An embodiment of the logic circuit 40 is shown in FIG. 2. The Unit which is provided by the flip-flops F1A–F3A, the inverter I1a and the NAND gate N1A, and which detects the signal A coming from the comparator R1 and can indicate an instantaneous short-circuit situation to the supply Vcc checks that there is no change in the signal A during the period of time in which the GATE signal is high. If this situation occurs, then the flip-flop F3A will be loaded with the signal QN="1" and the logic signal F_Vcc will consequently be at level "1", indicating a short-circuit to the supply Vcc. If, on the other hand, a change occurs, the signal F_Vcc will go to "0".

The unit F1B–F3B and N1b has the same function in relation to the signals B and F_gnd. The function of the flip-flop F1 and the invertor I2 is to enable the circuits which detect changes, and load the flip-flops F3A and F3B which store the fault indication.

The circuit which detects the changes in the signal A, and the associated timing circuitry, will be described in detail below. The description of the circuitry relating to the signals B and F_gnd, however, will be omitted since it is similar to that which will be given for signal A.

When this circuitry is disabled, the signal DIA is low. In these conditions, whatever the value of the GATE signal, the flip-flop F1 will have a low-level "clear" signal (C) and a "0" will thus be stored and will be available at the output Q. The output Q of the flip-flop F1 in turn drives the "clear" inputs of the flip-flops F1A, F2A and (F1B, F2B), ensuring that the various flip-flops are loaded with a "0" and that their respective outputs QN are at "1".

When the signal DIA goes to "1", the situation described does not change and, whatever happens to the signal A, the outputs QN of the flip-flops F1A and F2A do not change. However, the output of the NAND gate N1A can change according to the value of the signal A and, more precisely, the output is the signal A inverted.

When the GATE signal goes high because, after the signal DIA is high, the "clear" signal of the flip-flop F1 is at "1", a "1" is stored in the flip-flop F1 (since D is at "1"). A "1" at the terminal Q of the flip-flop F1 brings the "clear" signals of the flip-flops F1A and F2A to "1". The first positive change which may occur (after the GATE signal has gone high) is the signal A, thus brings the output QN of the flip-flop F1A to "0" and, similarly, the first negative change which may occur in the signal A after the GATE signal has gone high brings the output QN of the flip-flop F2A to "0". Even if only one of the two events described above were to occur, the output of the NAND gate N1A would be forced to "1" since one of the two inputs coming from the outputs QN of the flip-flops F1A and F2A would be at "0".

With the output of the NAND gate N1A at "1", when the GATE signal falls to "0" (which represents the moment at which the intermittent short-circuit observation period ends, this period having started when the GATE signal rose to "1"), by virtue of the inverter I2, there will be a leading edge at the clock input of the flip-flop F3A with the result that a "0" is loaded into the terminal QN of the flip-flop F3A. Thus, even if only one positive or negative change occurs in the signal A, the output F_Vcc remains at 0, indicating that there is not a stable short-circuit to the supply Vcc.

If, however, within the same observation period, there is no change in the signal A, the outputs QN of the flip-flops F1A and F2A always remain at "1" and the output of the NAND gate N1A will be the signal A inverted. The result is that the flip-flop F3A will load the value of the signal A into the terminal QN. If the signal A is "1", the signal F_Vcc will also be at "1", indicating a stable short-circuit to the supply Vcc.

In summary, the logic circuit 40 checks, in the time interval in which the GATE signal is high, if there has been even a single change of level in A and B, in which case, the outputs F_Vcc and F_gnd are brought to and remain at low level. If, however, the levels of A and B do not change in the observation period, their levels are reproduced at the outputs F_Vcc and F_gnd, indicating that:

no short-circuit has occurred either to ground or to Vcc, if A and B (and hence F_Vcc and F_gnd) are at low level; and a stable short-circuit has occurred to Vcc or to ground if A or B (F_Vcc or F_gnd) is at high level.

Naturally, the principle of the invention remains the same, the details of construction and forms of embodiment may be varied widely with respect to those described and illustrated, without thereby departing from the scope of the present invention as defined in the appended claims.

That which is claimed is:

1. A device for detecting a condition of non-intermittent short-circuit of a desired terminal of a circuit towards ground or towards a direct-current voltage supply of the circuit, the device comprising:

current-generating means connected to the desired terminal and for generating a current of predetermined intensity selectively into or out of the desired terminal;

first voltage-comparator means connected to the desired terminal and connected to the current-generating means in a manner such that the current-generating means generates a current in the inward direction relative to the desired terminal when a voltage between the desired terminal and ground is greater than a first voltage threshold, and generates a current in the outward direction relative to the desired terminal when the voltage between the desired terminal and around is less than a second voltage threshold, the first voltage threshold being greater than or equal to the second voltage threshold;

second voltage-comparator means connected to the desired terminal and for supplying a first and a second signal, respectively, when the voltage between the desired terminal and ground is close to the supply voltage and close to ground, respectively; and processing-circuit means connected to the second comparator means for detecting whether the first or the second signal, respectively, lasts for a predetermined period of time and, responsive thereto, for supplying an output signal indicative of a short-circuit of the terminal towards the voltage supply or towards ground, respectively.

2. A device according to claim 1, wherein said current-generating means comprises, between the voltage supply and ground:

a reference resistor;

a first circuit branch comprising a first transistor having a collector-emitter path in series with said reference resistor;

circuit means for applying to the reference resistor a voltage of predetermined value less than that of the supply;

a first and a second current mirror connected to the desired terminal and coupled to the first transistor in a manner such that the first and second current mirrors can conduct currents substantially equal to and double a current flowing in the first transistor, respectively; and an electronic switch connected to the first and second current mirrors and controlled by the first voltage-comparator means in a manner such that, when the voltage between the desired terminal and ground is below the second voltage threshold, the electronic switch is conductive and disables the second current mirror and the current flowing in the first current mirror flows in the outward direction relative to the desired terminal and, when the voltage between the desired terminal and ground is greater than the first voltage threshold, the electronic switch is cut off and a current substantially equal to a difference between the currents flowing in the first and second current mirrors flows into the desired terminal in the inward direction.

3. A device according to claim 2, wherein said circuit means comprises:

a resistive divider which is connected between the voltage supply and ground; and amplifier means with substantially unitary gain connected between an output of the resistive divider and the reference resistor so that current flowing in the first circuit branch depends essentially solely on the voltage supply and on the resistance values of the resistive divider and on the reference resistor.

4. A device according to claim 1, wherein said first voltage-comparator means comprises a threshold comparator circuit with hysteresis.

5. A device according to claim 1, wherein said second voltage-comparator means comprises:

a chain of three resistors connected between the voltage supply and ground; and a pair of threshold comparators each having a respective first input connected to a respective terminal of an intermediate resistor of the chain of three resistors and a second input connected to the desired terminal.

6. A device according to claim 5, wherein said processing-circuit means comprises a logic circuit including flip-flops; and wherein said logic circuit has an input for an external control signal a duration of which defines the predetermined period of time.

7. A device according to claim 6, wherein said logic circuit has two inputs connected to outputs of the threshold comparators, and said logic circuit has two outputs; and wherein said logic circuit is arranged to supply signals corresponding to outputs of the threshold comparators at its outputs only when there is no change in a level of these signals during the predetermined period of time.

8. A device for detecting a condition of non-intermittent short-circuit of a desired terminal of a circuit towards a first voltage supply or a second voltage supply of the circuit, the device comprising:

a current-generator connected to the desired terminal and for generating a current of predetermined intensity selectively into or out of the desired terminal;

a first voltage-comparator connected to the desired terminal and connected to the current-generator in a manner such that the current-generator generates a current in the inward direction relative to the desired terminal when a voltage between the desired terminal and the first voltage supply is greater than a first voltage threshold, and generates a current in the outward direction relative to the desired terminal when the voltage between the desired terminal and the first voltage supply is less than a second voltage threshold, the first voltage threshold being greater than or equal to the second voltage threshold;

a second voltage-comparator connected to the desired terminal and for supplying a first and a second signal, respectively, when the voltage between the desired terminal and the first voltage supply is close to the second supply voltage and close to the first voltage supply, respectively; and a processing circuit connected to the second comparator for detecting whether the first or the second signal, respectively, lasts for a predetermined period of time and, responsive thereto, for supplying an output signal indicative of a short-circuit of the terminal towards the second voltage supply or towards the first voltage supply, respectively.

9. A device according to claim 8, wherein said current-generator comprises, between the second voltage supply and the first voltage supply:

a reference resistor;

a first circuit branch comprising a first transistor having a collector-emitter path in series with said reference resistor;

a second circuit for applying to the reference resistor a voltage of predetermined value less than that of the second voltage supply;

a first and a second current mirror connected to the desired terminal and coupled to the first transistor in a manner such that the first and second current mirrors can conduct currents substantially equal to and double a current flowing in the first transistor, respectively; and an electronic switch connected to the first and second current mirrors and controlled by the first voltage-comparator in a manner such that, when the voltage between the desired terminal and second voltage supply is below the second voltage threshold, the electronic switch is conductive and disables the second current mirror and the current flowing in the first current mirror flows in the outward direction relative to the desired terminal and, when the voltage between the desired terminal and the first voltage supply ground is greater than the first voltage threshold, the electronic switch is cut off and a current substantially equal to a difference between the currents flowing in the first and second current mirrors flows into the desired terminal in the inward direction.

10. A device according to claim 9, wherein said second circuit comprises:

a resistive divider which is connected between the second voltage supply and the first voltage supply; and an amplifier with substantially unitary gain connected between an output of the resistive divider and the reference resistor so that current flowing in the first circuit branch depends essentially solely on the second supply voltage and on the resistance values of the resistive divider and on the reference resistor.

11. A device according to claim 8, wherein said first voltage-comparator comprises a threshold comparator circuit with hysteresis.

12. A device according to claim 8, wherein said second voltage-comparator comprises:

a chain of three resistors connected between the second voltage supply and the first voltage supply; and a pair of threshold comparators each having a respective first input connected to a respective terminal of an intermediate resistor of the chain of three resistors and a second input connected to the desired terminal.

13. A device according to claim 12, wherein said processing circuit comprises a logic circuit including flip-flops; and wherein said logic circuit has an input for an external control signal a duration of which defines the predetermined period of time.

14. A device according to claim 13, wherein said logic circuit has two inputs connected to outputs of the threshold comparators, and said logic circuit has two outputs; and wherein said logic circuit is arranged to supply signals corresponding to outputs of the threshold comparators at its outputs only when there is no change in a level of these signals during the predetermined period of time.

15. A device according to claim 8, wherein the first supply voltage is ground.

16. A device for detecting a condition of non-intermittent short-circuit of a desired terminal of a circuit towards a first voltage supply or a second voltage supply of the circuit, the device comprising:

a current-generator connected to the desired terminal and for generating a current of predetermined intensity selectively into or out of the desired terminal, said current-generator comprising between the second voltage supply and the first voltage supply a reference resistor, a first circuit branch comprising a first transistor having a collector-emitter path in series with said reference resistor, a second circuit for applying to the reference resistor a voltage of predetermined value less than that of the second voltage supply, and a first and a second current mirror connected to the desired terminal and coupled to the first transistor in a manner such that the first and second current mirrors can conduct currents substantially equal to and double a current flowing in the first transistor, respectively;

a first voltage-comparator connected to the desired terminal and connected to the current-generator in a manner such that the current-generator generates a current in the inward direction relative to the desired terminal when a voltage between the desired terminal and the first voltage supply is greater than a first voltage threshold, and generates a current in the outward direction relative to the desired terminal when the voltage between the desired terminal and the first voltage supply is less than a second level, the first voltage threshold being greater than or equal to the second voltage threshold;

a second voltage-comparator connected to the desired terminal and for supplying a first and a second signal, respectively, when the voltage between the desired terminal and the first voltage supply is close to the second supply voltage and close to the first voltage supply, respectively; and a processing circuit connected to the second comparator for detecting whether the first or the second signal, respectively, lasts for a predetermined period of time and, responsive thereto, for supplying an output signal indicative of a short-circuit of the terminal towards the second voltage supply or towards the first voltage supply, respectively.

17. A device according to claim 16, wherein said current generator further comprises an electronic switch connected to the first and second current mirrors and controlled by the first voltage-comparator in a manner such that, when the voltage between the desired terminal and second voltage supply is below the second voltage threshold, the electronic switch is conductive and disables the second current mirror and the current flowing in the first current mirror flows in the outward direction relative to the desired terminal and, when the voltage between the desired terminal and the first voltage supply ground is greater than the first voltage threshold, the electronic switch is cut off and a current substantially equal to a difference between the currents flowing in the first and second current mirrors flows into the desired terminal in the inward direction.

18. A device according to claim 17, wherein said second circuit comprises:

a resistive divider which is connected between the second voltage supply and the first voltage supply; and an amplifier with substantially unitary gain connected between an output of the resistive divider and the reference resistor so that current flowing in the first circuit branch depends essentially solely on the second supply voltage and on the resistance values of the resistive divider and on the reference resistor.

19. A device according to claim 16, wherein said first voltage-comparator comprises a threshold comparator circuit with hysteresis.

20. A device according to claim 16, wherein said second voltage-comparator comprises:

a chain of three resistors connected between the second voltage supply and the first voltage supply; and a pair of threshold comparators each having a respective first input connected to a respective terminal of an intermediate resistor of the chain of three resistors and a second input connected to the desired terminal.

21. A device according to claim 20, wherein said processing circuit comprises a logic circuit including flip-flops; and wherein said logic circuit has an input for an external control signal a duration of which defines the predetermined period of time.

22. A device according to claim 21, wherein said logic circuit has two inputs connected to outputs of the threshold comparators, and said logic circuit has two outputs; and wherein said logic circuit is arranged to supply signals corresponding to outputs of the threshold comparators at its outputs only when there is no change in a level of these signals during the predetermined period of time.

23. A device according to claim 16, wherein the first supply voltage is ground.

24. A method for detecting a condition of non-intermittent short-circuit of a desired terminal of a circuit towards a first voltage supply or a second voltage supply of the circuit, the method comprising the steps of:

generating a current of predetermined intensity selectively into or out of the desired terminal;

providing a first voltage-comparator connected to the desired terminal and to the current-generator in a manner such that the current generator generates a current in the inward direction relative to the desired terminal when a voltage between the desired terminal and the first voltage supply is greater than a first voltage threshold, and generates a current in the outward direction relative to the desired terminal when the voltage between the desired terminal and the first voltage supply is less than a second voltage threshold, the first voltage threshold being greater than or equal to the second voltage threshold;

providing a second voltage-comparator connected to the desired terminal and for supplying a first and a second signal, respectively, when the voltage between the desired terminal and the first voltage supply is close to the second supply voltage and close to the first voltage supply, respectively; and detecting whether the first or the second signal, respectively, lasts for a predetermined period of time and, responsive thereto, for supplying an output signal indicative of a short-circuit of the terminal towards the second voltage supply or towards the first voltage supply, respectively.

25. A method according to claim 24, wherein the first supply voltage is ground.

* * * * *